United States Patent
Conway

(10) Patent No.: US 8,320,473 B1
(45) Date of Patent: Nov. 27, 2012

(54) DATA COMMUNICATION SYSTEM UTILIZING OPTIMIZED CODE TABLE SIGNALING

(75) Inventor: Bruce Conway, Williston, ND (US)

(73) Assignee: Prairie Blue, LLC, Williston, ND (US)

( * ) Notice: Subject to any disclaimer, the term of this patent is extended or adjusted under 35 U.S.C. 154(b) by 325 days.

(21) Appl. No.: 12/700,134

(22) Filed: Feb. 4, 2010

Related U.S. Application Data

(63) Continuation of application No. 12/690,171, filed on Jan. 20, 2010, now abandoned.

(51) Int. Cl.
 *H04L 27/00* (2006.01)
 *H04L 27/06* (2006.01)
 *H03M 7/00* (2006.01)

(52) U.S. Cl. ......... 375/259; 375/295; 375/340; 341/106

(58) Field of Classification Search .................. 375/259, 375/265, 295, 316, 340, 341, 261, 298, 302; 341/51, 106; 714/792
See application file for complete search history.

(56) References Cited

U.S. PATENT DOCUMENTS

| | | | | |
|---|---|---|---|---|
| 5,577,087 A | * | 11/1996 | Furuya | 375/259 |
| 5,612,651 A | * | 3/1997 | Chethik | 375/261 |
| 7,197,094 B2 | * | 3/2007 | Tung | 375/341 |
| 7,301,983 B1 | * | 11/2007 | Horne | 375/130 |
| 7,400,689 B2 | * | 7/2008 | Matsumoto et al. | 375/295 |
| 2003/0137438 A1 | * | 7/2003 | Yokose | 341/106 |
| 2006/0056538 A1 | | 3/2006 | Nam et al. | |
| 2008/0071847 A1 | | 3/2008 | Cho et al. | |

FOREIGN PATENT DOCUMENTS

WO 2006049419 5/2006

\* cited by examiner

*Primary Examiner* — Betsy Deppe
(74) *Attorney, Agent, or Firm* — Suiter Swantz pc llo

(57) ABSTRACT

A data communication method is disclosed. The method may include obtaining a data vector to be communicated; selecting a code table configured for facilitating the data communication; selecting a vector of real numbers representative of the data vector using the code table; and transmitting the vector of real numbers, wherein the vector of real numbers is transformed, upon reception, into a best corresponding vector by utilizing the code table.

18 Claims, 4 Drawing Sheets

DATA COMMUNICATION SYSTEM UTILIZING OPTIMIZED CODE TABLE SIGNALING

CROSS-REFERENCE TO RELATED APPLICATIONS

The present application is a continuation of U.S. application Ser. No. 12/690,171, filed Jan. 20, 2010, which claimed the benefit under 35 U.S.C. §119(e) of U.S. Provisional Application Ser. No. 61/256,784, filed Oct. 30, 2009, which are both incorporated herein by reference.

TECHNICAL FIELD

The disclosure generally relates to the field of communication systems, particularly to a data communication system utilizing optimized code table signaling.

BACKGROUND

Various data communication schemes are available for radio communication systems. Modulation techniques (e.g., analog or digital modulation) may be utilized in such communication schemes. In addition, encoding and decoding processes may also be utilized to improve the security of the data being communicated.

SUMMARY

The present disclosure is directed to a data communication method. The method may comprise obtaining a data vector to be communicated; selecting a code table configured for facilitating said data communication; selecting a vector of real numbers representative of said data vector using said code table; and transmitting said vector of real numbers, wherein said vector of real numbers is transformed, upon reception, into a best corresponding vector by utilizing said code table.

A further embodiment of the present disclosure is directed to a data communication method. The method may comprise obtaining a code table configured for facilitating data communication; receiving a vector of real numbers, the vector of real numbers being representative of a data vector of selected from said code table; and transforming said vector of real numbers into a best corresponding vector by utilizing said code table.

A further embodiment of the present disclosure is directed to a data communication system. The data communication system may comprise an input module for obtaining a data vector to be communicated; a code table selecting module for selecting a code table configured for facilitating said data communication; a vector selecting module for selecting a vector of real numbers representative of said data vector from said code table; and a transmitter for transmitting said vector of real numbers to a receiver, wherein said vector of real numbers is transformed, upon reception, into a best corresponding vector by utilizing said code table.

It is to be understood that both the foregoing general description and the following detailed description are exemplary and explanatory only and are not necessarily restrictive of the present disclosure. The accompanying drawings, which are incorporated in and constitute a part of the specification, illustrate subject matter of the disclosure. Together, the descriptions and the drawings serve to explain the principles of the disclosure.

BRIEF DESCRIPTION OF THE DRAWINGS

The numerous advantages of the disclosure may be better understood by those skilled in the art by reference to the accompanying figures in which.

DETAILED DESCRIPTION

Reference will now be made in detail to the subject matter disclosed, which is illustrated in the accompanying drawings.

Modulation techniques (e.g., analog or digital modulation) may be utilized in such communication schemes. With many digital communications modulation schemes, the signal constellation is a useful descriptor, representation, and analysis tool. In practice, the number of signal constellations has been limited in order to keep modulation and demodulation easier to implement while optimizing the system for channel capacity. Quadrature Amplitude Modulation (QAM) is an example of such a digital modulation scheme.

By virtue of improved modulation and demodulation implementations and high capacity digital signal processing, the ongoing advances in technology create the opportunity to: expand the set of signal constellations that can be effectively implemented, expanding the set of modulation schemes that the expanded set of signal constellations can support, and expand the set of communications systems performance parameters that that can be met.

The communications system design process is thus transformed to creating signal constellations that provide the desired system performance. In one embodiment, the implementation of the communications system implements the signal constellations as code tables, thus such a system may be referred to as an Optimized Code Table Signaling (OCTS) system.

Figure 1:
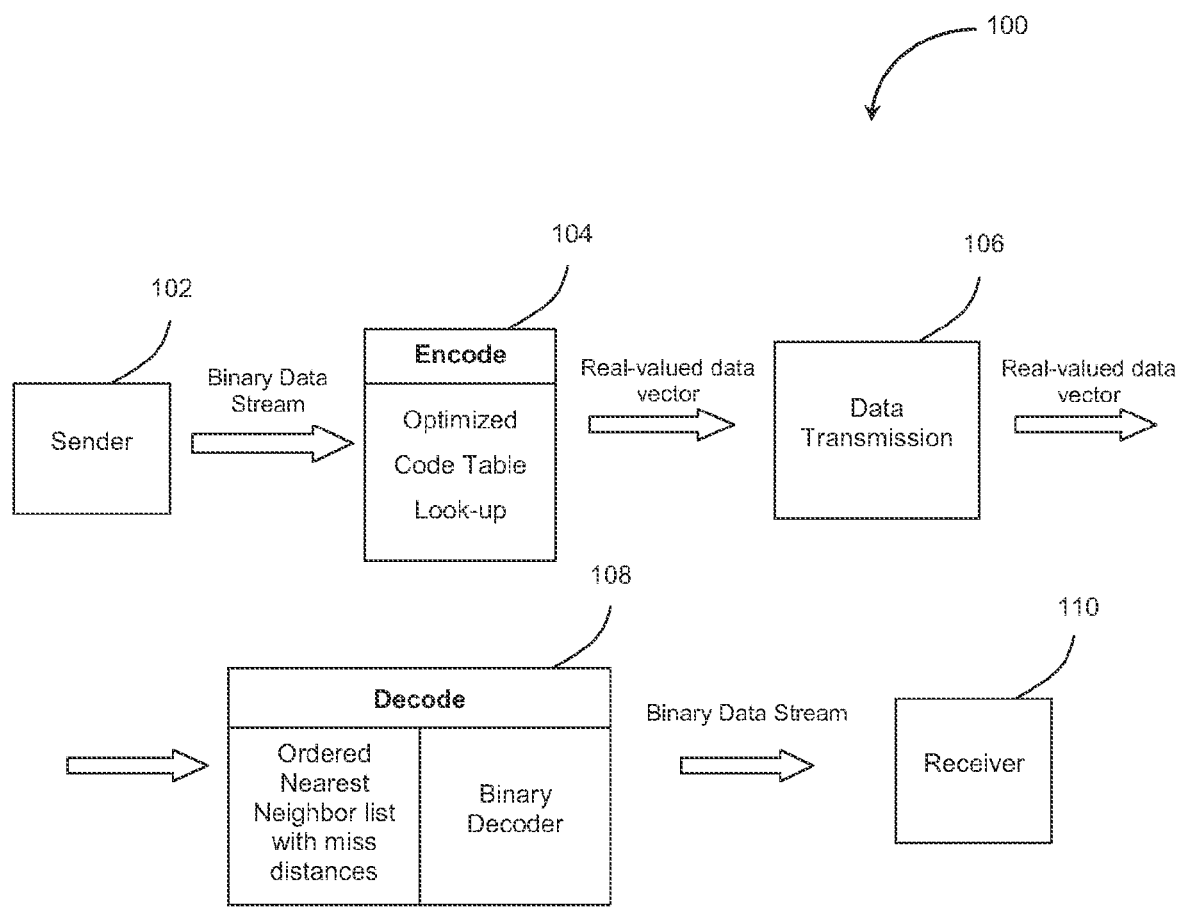
FIG. 1 is a block diagram illustrating a data communication system for transmitting data from one or more senders to one or more receivers.

FIG. 1 shows a block diagram illustrating steps performed by a data communication system/method 100 in accordance with the present disclosure. The data communication system 100 may be utilized for transmitting data from one or more senders 102 to one or more receivers 110. The data communication system 100 is configured to utilize the mapping of a binary bit stream to real-valued vectors, where the mapping functions are determined based on the characteristics/properties of the communication path/environment.

In one embodiment, upon receiving data from a sender 102 in a computer readable format (e.g., in binary format or as a data vector of integers), step 104 may transform (encode) the received data into a vector of real numbers (may also be referred to as a real-valued data vector). For example, each n-bit binary word may be transformed into a set of m real-valued numbers. The transformation may be calculated in real-time for each binary word based on the mapping function, or performed as a lookup in a pre-computed table. For example, Trellis Coded Modulation (TCM) may be utilized for transforming a sequence of n-bit binary words into a sequence of m real-valued numbers based on the pre-computed table.

An exemplary lookup table is partially shown below. As illustrated in this exemplary lookup table, each 6-bit binary word (partially enumerated under column "Symbol") is mapped to a set of 6 real-valued numbers (partially enumerated under column "Signal Vectors"). For instance, utilizing this exemplary lookup table, the binary word "001010" originally sent from the sender 102 may be transformed to a real-valued data vector (−0.40868, 1.50797, −0.85309, −0.96583, 1.23425, −0.14811).

real-valued numbers to locate the n-bit binary word represented by the given set of m real-valued numbers. For example, for each set of m real-valued numbers, the decoding process may locate an element in the lookup table that has the smallest Euclidian distance away from this set of m real-valued numbers. Thus, the n-bit binary word that corresponds to this element in the lookup table is the n-bit binary word represented by this set of m real-valued numbers.

Once step 108 completes the transformation of the real-valued data vector into data represented in the computer readable format (originally sent by the sender 102), the computer readable data is transmitted to the receiver 110.

| | Data bit | | Signal vector | | | | | |
|---|---|---|---|---|---|---|---|---|
| Symbol | 5 4 3 2 1 0 | Element 5 | Element 4 | Element 3 | Element 2 | Element 1 | Element 0 |
| 0 | 0 0 0 0 0 0 | 0.00000 | 0.00000 | 0.00000 | 0.00000 | 0.00000 | 0.00000 |
| 1 | 0 0 0 0 0 1 | 0.76805 | −0.73178 | 0.68269 | −0.61883 | 0.53819 | −0.43901 |
| 2 | 0 0 0 0 1 0 | −0.93860 | 0.67477 | −0.27151 | −0.17753 | 0.58072 | −0.86662 |
| 3 | 0 0 0 0 1 1 | −0.17055 | −0.05701 | 0.41119 | −0.79636 | 1.11891 | −1.30562 |
| 4 | 0 0 0 1 0 0 | 0.88803 | −0.08231 | −0.79467 | 0.94317 | −0.24821 | −0.65976 |
| 5 | 0 0 0 1 0 1 | 1.65607 | −0.81410 | −0.11198 | 0.32435 | 0.28998 | −1.09877 |
| 6 | 0 0 0 1 1 0 | −0.05057 | 0.59245 | −1.06618 | 0.76564 | 0.33251 | −1.52637 |
| 7 | 0 0 0 1 1 1 | 0.71748 | −0.13933 | −0.38348 | 0.14681 | 0.87070 | −1.96538 |
| 8 | 0 0 1 0 0 0 | 0.52991 | 0.83320 | −0.58158 | −0.78830 | 0.65353 | 0.71851 |
| 9 | 0 0 1 0 0 1 | 1.29796 | 0.10142 | 0.10112 | −1.40712 | 1.19173 | 0.27950 |
| 10 | 0 0 1 0 1 0 | −0.40868 | 1.50797 | −0.85309 | −0.96583 | 1.23425 | −0.14811 |
| 11 | 0 0 1 0 1 1 | 0.35936 | 0.77619 | −0.17039 | −1.58466 | 1.77244 | −0.58711 |
| . | . . . . . . | . | . | . | . | . | . |
| . | . . . . . . | . | . | . | . | . | . |
| . | . . . . . . | . | . | . | . | . | . |
| 55 | 1 1 0 1 1 1 | −0.41916 | −0.33039 | −0.16232 | 0.01198 | 0.33597 | −2.10459 |
| 56 | 1 1 1 0 0 0 | −0.60672 | 0.64214 | −0.36041 | −0.92313 | 0.11880 | 0.57930 |
| 57 | 1 1 1 0 0 1 | 0.16132 | −0.08964 | 0.32228 | −1.54196 | 0.65699 | 0.14029 |
| 58 | 1 1 1 0 1 0 | −1.54532 | 1.31690 | −0.63192 | −1.10066 | 0.69952 | −0.28732 |
| 59 | 1 1 1 0 1 1 | −0.77727 | 0.58512 | 0.05078 | −1.71949 | 1.23771 | −0.72633 |
| 60 | 1 1 1 1 0 0 | 0.28130 | 0.55982 | −1.15508 | 0.02004 | −0.12941 | −0.08046 |
| 61 | 1 1 1 1 0 1 | 1.04935 | −0.17196 | −0.47239 | −0.59878 | 0.40878 | −0.51947 |
| 62 | 1 1 1 1 1 0 | −0.65729 | 1.23459 | −1.42659 | −0.15749 | 0.45131 | −0.94708 |
| 63 | 1 1 1 1 1 1 | 0.11075 | 0.50281 | −0.74389 | −0.77632 | 0.98950 | −1.38608 |

It may be appreciated that the number of real-valued numbers utilized to represent an n-bit binary word may vary based on the properties of the communication path/environment. For example, fewer than 6 real-valued numbers may be utilized to represent a 6-bit binary word in a less noisy environment. However, for a very noisy environment, a 6-bit binary word may be transformed into a set of 6 (or more) real-valued numbers. It is understood that a small m value (the number of real-valued numbers used to represent an n-bit binary word) may increase transmission capacity, while a larger m value may provide better performance in a noisy environment. The specific values of n and m may be determined based on the properties (e.g., noise level, bit error rate and/or security level) of the communication environment.

Step 106 may transmit the transformed real-valued data vector to the receiver side. Standard communication mechanisms (e.g., radio communication technologies such as analog and/or digital modulation or spread-spectrum techniques) may be utilized for such transmissions. In one example, Quadrature Amplitude Modulation (QAM) is utilized for transmitting the transformed real-valued data vector from the sender side to the receiver side.

Upon receipt of the real-valued data vector on the receiver side, step 108 may transform (decode) the received real-valued data vector into the computer readable format originally sent by the sender 102. In one embodiment, the decoding process is performed as a table lookup for each set of m It may be appreciated that additional security is provided by transmitting the encoded real-valued data vectors instead of the original binary data stream. Since the transformation table (may also be referred to as code table) is not shared with a third party, decoding of the intercepted real-valued data vector (by the third party) into the format originally sent by the sender may be denied and/or deferred. Furthermore, the sender 102 and the receiver 110 may both have a pool of potential code tables suitable for performing the encoding and decoding. The sender 102 may inform the receiver 110 of the specific code table utilized for encoding via a table identifier (e.g., acknowledge the table identifier as a part of the initial handshake process, or send the identifier as a part of the data transmission), which may not be meaningful to the third party intercepting the transmission.

It is contemplated that the performance of the data communication system 100 is determined by the attributes of the code tables, which may be optimized based on the properties of the communication environment. It is understood that the code tables may not be unique for mapping an n-bit binary word to a set of m real-valued numbers. In one embodiment, the selection criteria for a suitable code table may include: 1) having a maximum distance between the data vectors while maintaining the maximum power in the data vectors and using the same dynamic range within each column; and 2) providing an acceptable encoding and decoding performance (e.g., above a certain threshold).

Figure 2:
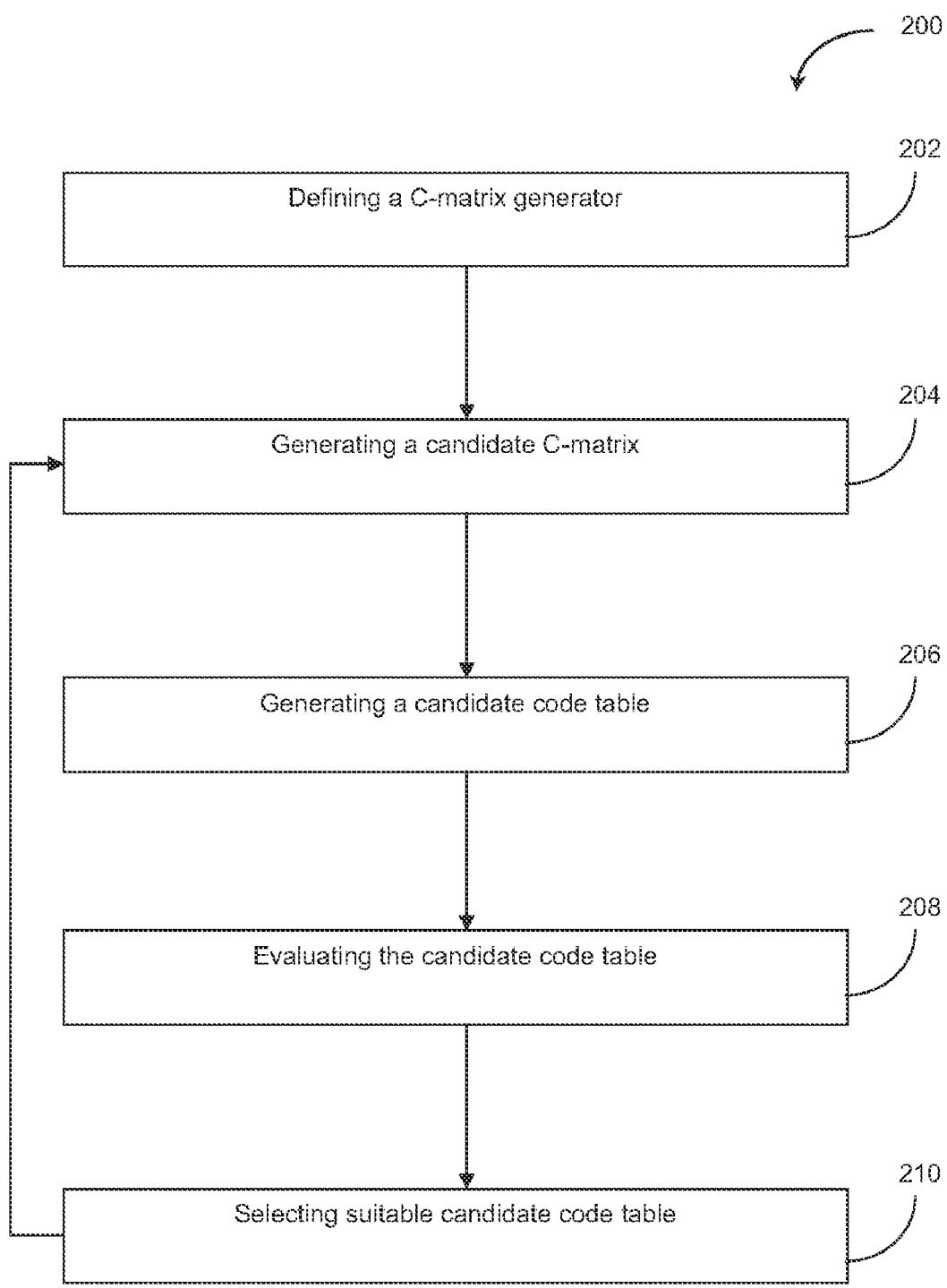
FIG. 2 is a flow diagram illustrating a method for generating a code table.

In one embodiment, an iterative process is utilized to generate a plurality of suitable code tables for a given communication environment prior to data transmission. The plurality of suitable code tables may then be shared among the senders and receivers to facilitate data communication utilizing the data communication system 100. FIG. 2 shows a flow diagram illustrating steps performed by a code table generation method 200 in accordance with the present disclosure.

A code table having orthogonal columns may be considered to be suitable for the given communication environment. Various methods may be utilized for creating code tables with orthogonal columns. In one embodiment, the suitable code tables may be defined using a "C-Matrix" (described below), upon which several mathematical processes are performed (on the input message) to generate an encoded message for transmission. It is understood that the C-matrix method is simply one example of a method to create code tables. Various other code table generation methods, such as empirically generated, may be utilized for creating suitable code tables. The definition of the "C-Matrix" and the mathematical transformations are described in the following sections, followed by two detailed examples.

Step 202 defines a C-matrix generator as a function of at least one of frequency, time and phase offset. An orthogonal basis functions may be utilized as the C-matrix generator, thus a change in one column does not affect any other columns. While any function that generates an orthogonal basis function is a viable candidate for the C-matrix generator, in one embodiment, the C-matrix generator is a cosine function defined as follows:

$$C = \begin{vmatrix} \cos(f_1 \cdot t_1 + \phi_1) & \cos(f_2 \cdot t_1 + \phi_2) & \ldots & \cos(f_n \cdot t_1 + \phi_n) \\ \cos(f_1 \cdot t_2 + \phi_1) & \cos(f_2 \cdot t_2 + \phi_2) & \ldots & \cos(f_n \cdot t_2 + \phi_n) \\ \vdots & \vdots & \vdots & \vdots \\ \cos(f_1 \cdot t_m + \phi_1) & \cos(f_2 \cdot t_m + \phi_2) & & \cos(f_n \cdot t_m + \phi_n) \end{vmatrix}$$

Where n is the number of bits in a binary word; m is the number of elements in the real-valued vector; $f_1, f_2, \ldots, f_n$ are chosen as the base frequency $f_1$ plus its multiples up to $f_n$. $t_1$ is chosen as 0.0; and $t_m$ is chosen such that the $f_1$ column traverses one full cycle of the cosine wave, and the $f_n$ column traverses n/2 full cycles of the cosine function. The series $t_1, t_2, \ldots, t_m$ is chosen to be monotonically increasing, but may have non-uniform spacing. The phase-offset terms represented by the series $\phi_1, \phi_2, \ldots, \phi_n$ are used to condition the range of values in the signal vector.

Step 204 is configured to generate a first candidate C-matrix utilizing the C-matrix generator defined in step 202. The values of n, m, $f_1, f_2, \ldots, f_n$, $t_1, t_2, \ldots, t_m$, and $\phi_1, \phi_2, \ldots, \phi_n$ utilized for generating the first candidate C-matrix, may be selected from sets that satisfy their respective definitions above. The table below provides an exemplary candidate C-matrix for the case n=6 and m=6. Frequency (f) is measured in radians/second, and time (t) in seconds. Phase offset is measured in radians.

|   | 1 | 2 | 3 | 4 | 5 | 6 |
|---|---|---|---|---|---|---|
| f | 0.523599 | 1.047198 | 1.570796 | 2.094395 | 2.617994 | 3.141593 |
| t | 0.000000 | 1.017460 | 2.039579 | 3.066378 | 4.097878 | 5.134101 |
| phi | 0.000000 | 0.000000 | 0.000000 | 0.000000 | 0.000000 | 0.000000 |

| C matrix | frequency > | | | | | |
|---|---|---|---|---|---|---|
| Time v | 1 | 2 | 3 | 4 | 5 | 6 |
| 1 | 1.000000 | 1.000000 | 1.000000 | 1.000000 | 1.000000 | 1.000000 |
| 2 | 0.861418 | 0.484082 | −0.027423 | −0.531328 | −0.887968 | −0.998496 |
| 3 | 0.481947 | −0.535455 | −0.998068 | −0.426576 | 0.586894 | 0.992279 |
| 4 | −0.034749 | −0.997585 | 0.104078 | 0.990352 | −0.172904 | −0.978336 |
| 5 | −0.543707 | −0.408765 | 0.988204 | −0.665822 | −0.264180 | 0.953095 |
| 6 | −0.898970 | 0.616295 | −0.209091 | −0.240361 | 0.641247 | −0.912562 |

Step 206 is configured to generate a candidate code table as shown below utilizing the first candidate C-matrix generated in step 204.

| Symbol | | | | | | | Data Vector | | | | | |
|---|---|---|---|---|---|---|---|---|---|---|---|---|
|  | 32 | 16 | 8 | 4 | 2 | 1 | 32 | 16 | 8 | 4 | 2 | 1 |
| 0 | 0 | 0 | 0 | 0 | 0 | 0 | 0.0000 | 0.0000 | 0.0000 | 0.0000 | 0.0000 | 0.0000 |
| 1 | 0 | 0 | 0 | 0 | 0 | 1 | 0.7455 | −0.7809 | 0.8224 | −0.8673 | 0.9122 | −0.9529 |
| 2 | 0 | 0 | 0 | 0 | 1 | 0 | 0.9759 | −0.9669 | 0.7494 | −0.3837 | −0.0473 | 0.4583 |
| 3 | 0 | 0 | 0 | 0 | 1 | 1 | 1.7214 | −1.7478 | 1.5718 | −1.2510 | 0.8649 | −0.4945 |
| 4 | 0 | 0 | 0 | 1 | 0 | 0 | −0.7921 | 0.9379 | −0.2141 | −0.6999 | 0.9828 | −0.4020 |
| 5 | 0 | 0 | 0 | 1 | 0 | 1 | −0.0467 | 0.1570 | 0.6083 | −1.5672 | 1.8951 | −1.3549 |
| 6 | 0 | 0 | 0 | 1 | 1 | 0 | 0.1838 | −0.0290 | 0.5353 | −1.0836 | 0.9355 | 0.0563 |
| 7 | 0 | 0 | 0 | 1 | 1 | 1 | 0.9292 | −0.8099 | 1.3577 | −1.9509 | 1.8477 | −0.8966 |
| 8 | 0 | 0 | 1 | 0 | 0 | 0 | 0.9586 | −0.3109 | −0.9391 | 0.3830 | 0.9037 | −0.4789 |
| 9 | 0 | 0 | 1 | 0 | 0 | 1 | 1.7041 | −1.0918 | −0.1167 | −0.4843 | 1.8159 | −1.4318 |
| 10 | 0 | 0 | 1 | 0 | 1 | 0 | 1.9345 | −1.2779 | −0.1896 | −0.0007 | 0.8563 | −0.0206 |
| . | . | . | . . . . | | | | . | . | . | . | . | . |
| . | . | . | . . . . | | | | . | . | . | . | . | . |
| 53 | 1 | 1 | 0 | 1 | 0 | 1 | −0.6762 | 0.0685 | 0.6489 | −2.1686 | 0.5337 | −2.5880 |

-continued

| Symbol | | | | | | Data Vector | | | | | |
|---|---|---|---|---|---|---|---|---|---|---|---|
| 32 | 16 | 8 | 4 | 2 | 1 | 32 | 16 | 8 | 4 | 2 | 1 |
| 54 | 1 | 1 | 0 | 1 | 1 | 0 | −0.4457 | −0.1175 | 0.5759 | −1.6850 | −0.4259 | −1.1768 |
| 55 | 1 | 1 | 0 | 1 | 1 | 1 | 0.2997 | −0.8984 | 1.3983 | −2.5523 | 0.4864 | −2.1297 |
| 56 | 1 | 1 | 1 | 0 | 0 | 0 | 0.3291 | −0.3995 | −0.8985 | −0.2184 | −0.4576 | −1.7120 |
| 57 | 1 | 1 | 1 | 0 | 0 | 1 | 1.0746 | −1.1804 | −0.0761 | −1.0857 | 0.4546 | −2.6649 |
| 58 | 1 | 1 | 1 | 0 | 1 | 0 | 1.3050 | −1.3664 | −0.1490 | −0.6021 | −0.5050 | −1.2537 |
| 59 | 1 | 1 | 1 | 0 | 1 | 1 | 2.0505 | −2.1473 | 0.6734 | −1.4694 | 0.4073 | −2.2066 |
| 60 | 1 | 1 | 1 | 1 | 0 | 0 | −0.4630 | 0.5385 | −1.1126 | −0.9183 | 0.5252 | −2.1141 |
| 61 | 1 | 1 | 1 | 1 | 0 | 1 | 0.2824 | −0.2424 | −0.2902 | −1.7857 | 1.4374 | −3.0669 |
| 62 | 1 | 1 | 1 | 1 | 1 | 0 | 0.5129 | −0.4285 | −0.3631 | −1.3020 | 0.4778 | −1.6557 |
| 63 | 1 | 1 | 1 | 1 | 1 | 1 | 1.2583 | −1.2094 | 0.4593 | −2.1693 | 1.3901 | −2.6086 |

To further explain the generation of the candidate code table, let the n-bit binary-valued input data vector to be defined as x (i.e., an n×1 vector), and the m-element real-valued vector to be defined as y (i.e., an m×1 vector). The candidate code table may be generated as a matrix multiplication y=C×x. The matrix multiplication is a mapping from a binary set (the input) to a set of real numbers (the signal to be transmitted). Therefore, each possible 6-bit binary word in the above example (under column "Symbol") is multiplied by the C-matrix to produce a corresponding 6-element real-valued vector (under column "Data Vector").

Once the candidate code table is generated utilizing the candidate C-matrix, step 208 is configured to evaluate the candidate code table with a performance metric. The performance metric may be a function of the channel characteristics and the modulation requirements. In one embodiment, the candidate code table is evaluated based on a minimum value in the distance separation table. For example, step 208 may calculate the Mean Free Euclidian Distance between each n-bit binary word (symbol) relative to other n-bit binary words based on the values of the corresponding data vectors in the candidate code table. Once the Mean Free Euclidian Distances are computed (i.e., for each n-bit binary word relative to all other n-bit binary words), a minimum separation distance may be determined.

The minimum Mean Free Euclidian Distance of the candidate code table may be recorded, and step 204 may be invoked again to generate a second candidate C-matrix with a different set of values for $f_1, f_2, \ldots, f_n, t_1, t_2, \ldots, t_m$, and/or $\phi_1, \phi_2, \ldots, \phi_n$. Step 206 may then generate a second candidate code table utilizing the second candidate C-matrix. Step 208 may calculate the minimum Mean Free Euclidian Distance of the second candidate code table, and step 210 is configured to compare the minimum Mean Free Euclidian Distances of the first and second candidate code tables and select the candidate code table that has the greater minimum Mean Free Euclidian Distance. Steps 204 through 210 may be repeated until a satisfactory code table is identified (e.g., the candidate code table that has the greatest minimum Mean Free Euclidian Distance). Alternatively, steps 204 through 210 may be repeated until the minimum Mean Free Euclidian Distance of the current code table has been maximized (that is, the values are asymptotically approaching the maximum).

It is contemplated that more than one code table may provide satisfactory performance. Therefore, step 210 may be configured to select multiple code tables that perform above a certain threshold. For example, a required separation distance threshold may be determined based on the characteristics of the communication environment. In this manner, if the minimum separation distance of a candidate code table is above the required separation distance threshold, this candidate code table may be deemed satisfactory. Steps 204 through 210 may be repeated until a certain number of satisfactory code tables are identified.

It is understood that step 204 may utilize various techniques for generating new candidate C-matrixes. In one example, step 204 may select evenly-spaced values for $f_1, f_2, \ldots, f_n, t_1, t_2, \ldots, t_m$, and $\phi_1, \phi_2, \ldots, \phi_n$. Alternatively, other sampling algorithms such as Monte Carlo or Genetic Algorithms may be utilized. Additional tuning strategies may also be utilized for searching the values. For example, non-uniform time samples may be utilized when the time samples are bunched more closely in the center of the distribution than at the peripheries. In another example, varying the signal vectors across the full set of symbols may allow the range of individual encoded data elements to increase as the variance increases. In still another example, the peak-to-valley signal power ratio may be utilized to create opportunities to optimize performance for a specific channel.

Upon completion of the code table generation method 200, the satisfactory transformation tables may be shared among the senders and receivers to facilitate the encoding and decoding processes. It is understood that such transformation tables may be stored digitally on computers accessible to the senders/receivers, or they may be stored directly in the firmware of the transmission devices utilized by the senders/receivers.

As previously described, it may be appreciated that the number of real-valued numbers utilized to represent an n-bit binary word may vary based on the properties of the communication environment. For example, if n=m, the C-matrix is square and the signal vector and the input data vector are identical in length (an exemplary 6×6 C-matrix is presented above). If n>m, the signal vector has fewer elements than the data vector, and if n<m the signal vector has more elements than the data vector. In practice, if the signal to noise ratio is large, n can be larger than m and the channel capacity is increased. If the signal to noise ratio is small, m can be made larger than n, decreasing channel capacity while improving the bit error rate. Using m and n as design variables provides fine-grained management of bit error rate and capacity.

For example, in a communication environment where the signal to noise ratio is large, m may be made smaller than n to increase channel capacity. Step 204 may generate an n×m C-matrix utilizing the values of n, m, $f_1, f_2, \ldots, f_n, t_1, t_2, \ldots, t_m$, and $\phi_1, \phi_2, \ldots, \phi_n$. The table below provides another exemplary candidate C-matrix for the case n=6 and m=4. As discussed above, the frequencies remain the same, and the endpoints of the time sample remain the same, but the intermediate time sample points change.

|       | 1        | 2        | 3        | 4        | 5        | 6        |
|-------|----------|----------|----------|----------|----------|----------|
| f     | 0.523599 | 1.047198 | 1.570796 | 2.094395 | 2.617994 | 3.141593 |
| t     | 0.000000 | 1.698354 | 3.409688 | 5.134101 |          |          |
| phi   | 0.000000 | 0.000000 | 0.000000 | 0.000000 | 0.000000 | 0.000000 |

| C matrix |   |   | frequency > |   |   |   |
|----------|---|---|---|---|---|---|
| Time v | 1 | 2 | 3 | 4 | 5 | 6 |
| 1 | 1.000000 | 1.000000 | 1.000000 | 1.000000 | 1.000000 | 1.000000 |
| 2 | 0.629990 | −0.206226 | −0.889830 | −0.914942 | −0.262979 | 0.583594 |
| 3 | −0.212871 | −0.909372 | 0.600028 | 0.653915 | −0.878427 | −0.279932 |
| 4 | −0.898970 | 0.616295 | −0.209091 | −0.240361 | 0.641247 | −0.912562 |

The new candidate code table generated in step 206 based on the new 6×4 candidate C-matrix may be illustrated as follows:

| Symbol |    |   |   |   |   | Data Vector |         |         |         |
|--------|----|---|---|---|---|---|---|---|---|
| 32 | 16 | 8 | 4 | 2 | 1 | 8 | 4 | 2 | 1 |
| 0  | 0 | 0 | 0 | 0 | 0 | 0.0000 | 0.0000 | 0.0000 | 0.0000 |
| 1  | 0 | 0 | 0 | 0 | 1 | 0.8224 | −0.8673 | 0.9122 | −0.9529 |
| 2  | 0 | 0 | 0 | 1 | 0 | 0.7494 | −0.3837 | −0.0473 | 0.4583 |
| 3  | 0 | 0 | 0 | 1 | 1 | 1.5718 | −1.2510 | 0.8649 | −0.4945 |
| 4  | 0 | 0 | 1 | 0 | 0 | −0.2141 | −0.6999 | 0.9828 | −0.4020 |
| 5  | 0 | 0 | 1 | 0 | 1 | 0.6083 | −1.5672 | 1.8951 | −1.3549 |
| 6  | 0 | 0 | 1 | 1 | 0 | 0.5353 | −1.0836 | 0.9355 | 0.0563 |
| 7  | 0 | 0 | 1 | 1 | 1 | 1.3577 | −1.9509 | 1.8477 | −0.8966 |
| 8  | 0 | 1 | 0 | 0 | 0 | −0.9391 | 0.3830 | 0.9037 | −0.4789 |
| 9  | 0 | 1 | 0 | 0 | 1 | −0.1167 | −0.4843 | 1.8159 | −1.4318 |
| 10 | 0 | 1 | 0 | 1 | 0 | −0.1896 | −0.0007 | 0.8563 | −0.0206 |
| .  | . | . | . | . | . | . | . | . | . |
| .  | . | . | . | . | . | . | . | . | . |
| 53 | 1 | 1 | 0 | 1 | 0 | 0.6489 | −2.1686 | 0.5337 | −2.5880 |
| 54 | 1 | 1 | 0 | 1 | 1 | 0.5759 | −1.6850 | −0.4259 | −1.1768 |
| 55 | 1 | 1 | 0 | 1 | 1 | 1.3983 | −2.5523 | 0.4864 | −2.1297 |
| 56 | 1 | 1 | 1 | 0 | 0 | −0.8985 | −0.2184 | −0.4576 | −1.7120 |
| 57 | 1 | 1 | 1 | 0 | 0 | −0.0761 | −1.0857 | 0.4546 | −2.6649 |
| 58 | 1 | 1 | 1 | 0 | 1 | −0.1490 | −0.6021 | −0.5050 | −1.2537 |
| 59 | 1 | 1 | 1 | 0 | 1 | 0.6734 | −1.4694 | 0.4073 | −2.2066 |
| 60 | 1 | 1 | 1 | 0 | 0 | −1.1126 | −0.9183 | 0.5252 | −2.1141 |
| 61 | 1 | 1 | 1 | 0 | 1 | −0.2902 | −1.7857 | 1.4374 | −3.0669 |
| 62 | 1 | 1 | 1 | 1 | 0 | −0.3631 | −1.3020 | 0.4778 | −1.6557 |
| 63 | 1 | 1 | 1 | 1 | 1 | 0.4593 | −2.1693 | 1.3901 | −2.6086 |

Both 6×6 and 6×4 C-matrices illustrated may encode a six element input vector (a 6-bit binary word), with the first example generating a six element signal vector and the second generating a four element signal vector.

It is contemplated that, upon generation of one or more satisfactory code tables, further optimization may be performed on such code tables to further improve the efficiency of the encoding and/or decoding process. In one embodiment, the optimization process may be performed on a column-by-column basis for a given code table. For instance, the minimum and maximum values in each column of the code table may be identified. Utilizing the maximum and minimum values, each column may be rescaled to make full use of the dynamic range of the communications channel. Such optimizations may provide marked improvement in performance. Additionally, the limits of the rescaling can be driven as a function of a signal-to-noise ratio. Specifically, when the SNR is low, the limits can be reduced to allow more "head room" for noise hits, avoiding clipping and maintaining operation within the linear portion of the channel. Thus, the data communication system of the present disclosure may accurately accommodate lower signal-to-noise ratios (i.e., it can maintain high integrity in a noisy environment by on-the-fly modifications of key parameters) achieved efficiently by computing the "separation" between the received signal and each of the vectors in the code table. The encoded word is selected as the vector with the minimum separation (i.e., the nearest element to the received signal).

It is understood that the encoding process 104 in the data communication method 100 may be performed in real-time as y=C×x for each n-bit binary-valued input data vector, or performed utilizing the code table generated based on the C-matrix. The decoding process 108 may be performed as a table lookup for each set of m real-valued numbers to locate the n-bit binary word represented by this set of m real-valued numbers. For example, for each set of m real-valued numbers to be decoded, the decoding process may locate the data vector in the lookup table that has the smallest Euclidian distance away from this set of m real-valued numbers, and the n-bit binary word that corresponds to this data vector in the lookup table is the n-bit binary word represented by this set of m real-valued numbers.

For example, the data vector in the lookup table that has the smallest Euclidian distance from the set of m real-valued numbers may be identified by calculating the Euclidian distance between the given set of m real-valued numbers and each data vector in the lookup table and search for the smallest Euclidian distance calculated. Alternatively, since the minimum separation distance is known for a given lookup table, the search may be truncated upon finding the first separation distance less than half the minimum separation distance of the given lookup table. Other decoding process improvements may include, for example, a pre-search operation on the lookup table for reducing the number of symbols to be interrogated. In another example, an ordered table of the sum of encoded vector elements may be used as boundaries for the search. In addition, since the encoding and decoding processes may be table driven—it is possible to re-order the table (for example, in Gray-coding order), which may be utilized to minimize the number of incorrect bits in the decoded symbol.

Two examples are provided to illustrate some of the aforementioned attributes of the present disclosure.

The first example illustrates the process of creating the code tables. The code tables created utilizing the C-matrix techniques provide data redundancy across the signal vector. This property enables adaptive signaling, and provides an opportunity for increased signal security. This is illustrated in the following exemplary steps.

In the first step, a code table metric of min MFED/sigma code table is defined as the minimum of the Mean Free Euclidian Distances between signal vectors normalized by the standard deviation of the full set of signal vectors.

In the second step, a 6×6 C-matrix is created. A code table may then be generated and optimized utilizing the iterative method described above, with the strategy of maximizing the min MFED/sigma code table. This optimized code table may be denoted as 6×6 optimized. The optimized value of min MFED/sigma code table may be saved for use as a reference (denote this as 6×6 min MFED/sigma code table).

In the third step, six 6×5 code tables may be created from the 6×6 optimized code table. For example, the first 6×5 code table may be created by deleting the first element from each of the original six element signal vectors, the second 6×5 code table may be created by deleting the second element from each of the original six element signal vectors, and so on until all six 6×5 tables are created. Calculate the min MFED/sigma code table for each of the six 6×5 tables, and find the maximum of this set. Denote the code table associated with this maximum as 6×5 optimized. Save the metric as 6×5 min MFED/sigma code table for use as a reference later.

In the fourth step, an additional value as min MFED for 6×5/sigma code table 6×6 is calculated. The difference between this value and 6×6 min MFED/sigma code table is the additional signal-to-noise margin provided by using the full six elements of the signal vector as opposed to using the best performing five element table. This additional signal-to-noise margin reflects the contribution of the redundancy built into the code table. The performance trade between the two code tables is to increase signal-to-noise margin with the 6×6 implementation at the expense of reducing the data rate to 5/6 of the 6×5 implementation.

Similar process of the third step may be repeated in the fifth step to create five 6×4 code tables from the 6×5 optimized. Select the code table with the maximum 6×4 min MFED/sigma code table, and save the value for later reference.

Similar process of the fourth step may be repeated in the sixth step to calculate the new signal-to-noise margin with the four-element signal vector, derived from the original six element signal vector.

The iterative process may continue until a single data element of the original signal vector remains. It is understood that the value of repeating the process diminishes as the minimum MFED decreases, until the data vectors are so tightly packed that it is not feasible to have a sufficiently large signal-to-noise ratio to achieve a reasonable probability of error.

For instance, consider the case where the signal-to-noise ratio is large enough that a three element vector chosen from the original six element vector provides a sufficiently small probability of error. Consider that this set of three of the six could be chosen from any permutation of the six, creating 120 possible sets of three. Now the transmission of the full six element data vector is indistinguishable from any of the 120 three element sets chosen pair-wise, thus complicating the task of a third party attempting to intercept and decode the message.

It is also understood that the minimum signal-to-noise margin for a specific code table may be estimated as half the minimum Mean Free Euclidian Distance for the code table. By tracking the distance between the received signal vector and the decoded signal vector and comparing this to half the minimum Mean Free Euclidian Distance for the code table, the effective signal-to-noise margin may be estimated. This estimate is a receiver-side estimate that can be used to adapt the system to a dynamic radio frequency environment. If the signal-to-noise margin is large, a receiver/transmitter protocol can be initiated to decrease the number of elements in the signal vector and increase the data rate. If the signal-to-noise margin is small, the same protocol can be used to increase the number of elements in the signal vector, which improves signal-to-noise margin and reduces the probability of error at the expense of data rate.

The second example illustrates that code tables created using the C-matrix techniques provide a method to create a large code space, such that an attempt to break the code using exhaustive search of the code space is prohibitive using state-of-the-art supercomputers.

Consider the 6×6 C-Matrix case as a baseline case, and consider two cases of signal to noise ratio (SNR). The 6×6 case has an alphabet of $2^6$=64 symbols. Case 1 is defined as the poor SNR case, where there are 128 slots for placing the 64 elements of the alphabet and detecting each with an acceptable probability of error. This analysis is an order-of-magnitude-only analysis, so the specific probability of error does not affect the order of magnitude. Case 2 is the strong SNR case, where there are 1000 slots for placing the 64 elements and detecting each with an acceptable probability of error.

The number of possible ways to place an ordered set of 64 elements in 128 slots can be calculated, and is prohibitively large (greater than $10^{100}$). The number of ways to place an ordered set of 64 elements in 1000 slots is substantially larger.

The six-element signal vector can be considered as a single encoded set, or as three two-element sets, or as a 4-element set plus a two-element set, or a five-element set plus a one-element set. This full family of encoded sets can be created such that each is indistinguishable from the six-element set as viewed on a signal vector element-by-element basis. This provides an additional measure of complexity, further expanding the code space.

Figure 3:
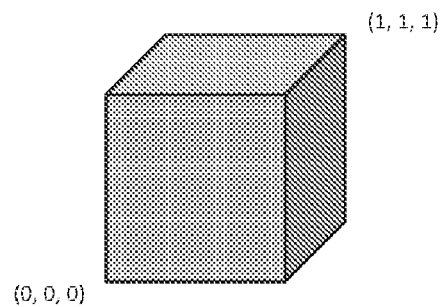
FIG. 3 is an illustration of a 3-bit data vector represented in a three-dimensional vector space.
Figure 4:
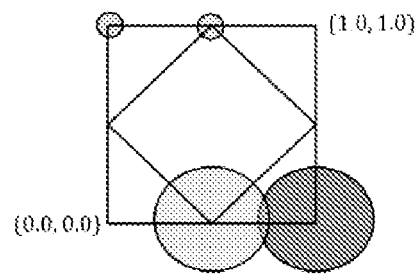
FIG. 4 is an illustration of a 3-bit data vector represented in a two-dimensional vector space.
Figure 5:
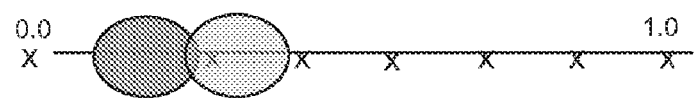
FIG. 5 is an illustration of a 3-bit data vector represented in a one-dimensional vector space.

Referring generally to FIGS. 3 through 5, the relationship between matrix dimensions (n and m), throughput (communication capacity), efficiency of data encoding/decoding, and noise immunity is illustrated. FIG. 3 depicts a 3-bit data vector represented in a 3 dimensional vector space. That is, a three dimensional coordinate system with a cube placed at the origin (0, 0, 0) and the opposing corner at (1, 1, 1). At each corner of the cube, there is now an encoded 3 bit data vector. The length of a side of the cube represents the full range of each element of the signal vector. This is the representation of a 3×3 C-matrix (i.e., the encoding process maps a 3-bit binary word to a set of 3 real-valued numbers).

As illustrated in FIG. 3, the minimum distance between any two encoded words is 1.0. This minimum is one of the parameters used to characterize the signal vector space.

FIG. 4 reduces the signal vector space to two dimensions, while maintaining the eight encoded points and the length of a side at 1.0, maintaining the same full range of the signal vector elements. The encoded three bit data vectors are represented by the corners of the squares. This is the representation of a 3×2 C-matrix (i.e., the encoding process maps a 3-bit binary word to a set of 2 real-valued numbers).

The minimum distance depicted in FIG. 4 is reduced to 0.5. If noise is represented by a circle of radius 0.1, one would be able to decode the signal perfectly, as illustrated on the top edge. If the noise is represented by a circle of radius 0.35, the areas of overlap are where errors occur, as illustrated on the bottom edge. Further, it now takes only two data elements to encode the three-bit information set. The capacity has been increased, but noise tolerance has decreased.

FIG. 5 reduces the signal vector space to one dimension, still maintaining all eight encoded points. This is the representation of a 3×1 C-matrix (i.e., the encoding process maps a 3-bit binary word to a set of 1 real-valued number). All eight positions are presented on the line, but we only need to transmit one number to communicate. The noise overlap occurs at the points where a ¹⁄₁₆th radius circle overlaps. As the dimension of the signal vector space is reduced, throughput increases and noise immunity decreases.

Therefore, it is understood that the iterative process of the code table generation method 200 is configured to generate the optimal code table for a given communication environment based on the relationship between matrix dimensions, throughput (communication capacity), efficiency of data encoding/decoding, and noise immunity as described above.

It may be appreciated that the data communication system 100 of the present disclosure may improve receiver-side performance measures. For instance, as the signal-to-noise ratio decreases, the separation distance increases. By generating a table of average separation distance as a function of signal-to-noise ratio, the received signal-to-noise ratio can be estimated, with its corresponding bit error rate. This information may then be made available to manage the link.

For example, the separation distances may be used to support a "soft" decoding strategy in support of advanced error correction methods. The additional information that is available with each search for the minimum separation distance may be the ordered list of separation distances and their associated decoded binary word. The separation distances may be a measure of the confidence in the decoded word. A small separation distance provides high confidence and a large separation distance provides low confidence. Thus an error correction strategy based on the measured confidence of each signal estimate may be possible.

Another receiver-side test may be to decode the signal with one data element missing. If this results in the same decoded value as the full vector decoding, the signal to noise ratio is very strong, and the signal could be transmitted with one fewer elements, thus increasing throughput.

It may also be appreciated that the data communication system 100 of the present disclosure may provide encryption and error correcting codes to provide communication security. Since the data communication system 100 has been reduced to table lookup functions, as long as the identical table is used for both encoding and decoding, the tables may be scrambled in many valid manners. Table structure must be established at the initial handshake. Once established, the session tables can then be exchanged to further enhance security. For example, the columns in a code table may be interchanged, symbols may be remapped, and symbol encoding may be driven by a different generating set. As long as the receive/transmit pair is synchronized, this scrambling can encrypt information without requiring additional symbols in the data stream.

The initial handshake may be established utilizing various synchronization strategies. In one example, for an n-bit word transmission, designated bits within this word may be utilized to identify an epoch boundary and a specific epoch. These designated bits may be distributed throughout the n bits and are coded via a table known to both the sender and receiver. Encoding these with an error correcting code with sufficient error correction capability may establish confidence in the received and decoded information. The designated bits may be further encoded with a shared key known to both the sender and receiver. The receiver may interrogate the received information and look for the epoch boundary identifier and utilize the specific epoch to complete the synchronization. Alternatively, other synchronization strategies may be utilized without departing from the spirit of the present disclosure. For example, a specific code table or set of code tables may be assigned to a specific user as an authentication tool.

Since the input to the system is a binary data stream, the error correcting codes applicable to digital data systems are applicable here. The encoding process (performed as a matrix multiply or a code table lookup) spreads information over multiple rows, which provides a built-in redundancy for providing higher levels of noise tolerance. Thus, the data communication method 100 may be capable of providing noise immunity, achieving bit error rates that reduce the need for error correcting codes and latencies cause by such codes. Throughput may be increased.

It may also be appreciated that the data communication system 100 of the present disclosure may provide a large code space and security mapping.

The data communication system of present disclosure may be implemented as technology that is consistent with and supports cognitive radio technology. The system may assess the radio frequency environment by means of the code table measures employed. For example, the Mean Free Euclidian Distance between a received signal vector and its decoded value provides an estimate of the received signal-to-noise ratio. Inclusion of a calibration signal vector in the transmitted signal stream can be used to further refine the estimate of the radio frequency environment. The code tables and their associated protocols can be used to control the communications system with a sufficient degree of granularity to detect and respond to both large and small changes in the radio frequency environment.

The data communication system of the present disclosure provides a mechanism to establish reliable, robust, high-data-rate wireless links in harsh, rapidly-changing RF environments; it may provide link stability while maintaining capacity and security. The data communication system provides a mechanism to optimize and manage channel capacity in a dynamic environment, and creates a very large code space. The system also provides integrated code space generation and management, communications system performance management, coding and modulation optimization, and implementation with very efficient algorithms.

Different from existing communications mechanisms, the data communication system of the present disclosure utilizes the mapping of a binary bit stream to real-valued vectors, where the mapping function determines system performance. The mapping function may be implemented efficiently as a table lookup algorithm. The data communication system of the present disclosure is not dependent on a particular modulation scheme, and may be adapted to meet the requirements of specific modulation schemes. Other differences include optimization flexibility and randomization.

The data communication system of the present disclosure provides efficient implementation with table lookup encoding and decoding, where the properties of the table drive the system performance. The tables can be generated off-line and stored, each optimized to satisfy a specific set of needs, driven by the desired level of security, the RF environment, signal modulation technologies, and channel capacity requirements. This implementation provides fine-grained control of channel capacity, optimized for a desired bit error rate as a function of the RF environment.

The data communication system of the present disclosure also provides receiver-side performance measures: "separation" distance measures may be used to estimate the signal-to-noise ratio (SNR) and determine optimal performance in a dynamic RF environment. Furthermore, the data communication system of the present disclosure provides a very large code space. Secure transmission is enabled without the use of an encryption layer. This allows the channels to be optimized for capacity. In addition, control channel information may be embedded within the data stream, and code synchronization may range from very open to very secure. It is understood that the data communication system may be applicable to any linear media, and may be used to increase security and capacity of a linear storage media.

It is to be noted that the foregoing described embodiments according to the present disclosure may be conveniently implemented using conventional general purpose digital computers programmed according to the teachings of the present specification, as will be apparent to those skilled in the computer programming art. Appropriate software coding may readily be prepared by skilled programmers based on the teachings of the present disclosure, as will be apparent to those skilled in the software art.

Figure 6:
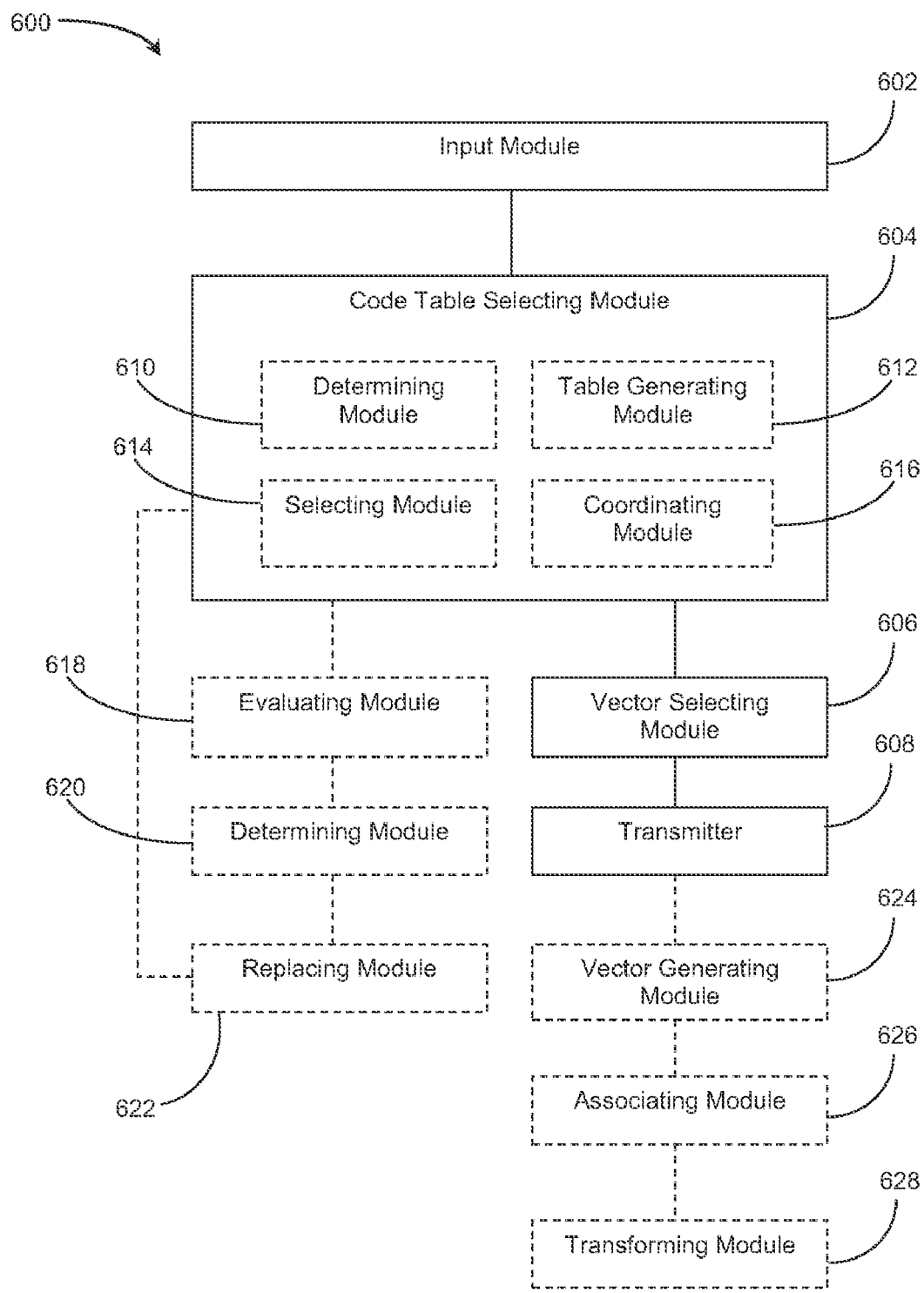
FIG. 6 is another block diagram illustrating a data communication system for transmitting data.

Referring to FIG. 6, a block diagram depicting a data communication system 600 is illustrated. The data communication system 600 may comprise: an input module 602 for obtaining a data vector to be communicated; a code table selecting module 604 for selecting a code table configured for facilitating said data communication; a vector selecting module 606 for selecting a vector of real numbers representative of said data vector from said code table (e.g., utilizing Trellis Coded Modulation); and a transmitter 608 for transmitting said vector of real numbers to a receiver. The vector of real numbers is transformed, upon reception, into a best corresponding vector by utilizing said code table as previously described. It is understood that each module of the data communication system 600 may be implemented in forms of a processing device configured for implementing a set of instructions, rules, or protocols. The processing device may include, but is not limited to, any type of computing device, computer processor, modem, storage device, networking device, or any other suitable mechanism for processing electronic instructions.

In one embodiment, the code table selecting module 604 may include a determining module 610 for determining at least one of a communication characteristic of a communication environment, a desired level of communication security, and a desired data throughput level. The code table selecting module 604 may select the code table at least partially based upon at least one of said communication characteristic of the communication environment, said desired level of communication security, and said desired data throughput level.

In addition, the code table selecting module 604 may also include a table generating module 612 for creating a plurality of candidate code tables, each of the plurality of candidate code tables having real-valued data entries. The code table selecting module 604 may select the code table from said plurality of candidate code tables based on an evaluation criterion. For example, the evaluation criterion may be at least partially based on at least one of said communication characteristic of the communication environment, said desired level of communication security, and said desired data throughput level. In another example, the evaluation criterion may include a minimum separation distance for a given candidate code table.

The code table selecting module 604 may further include a selecting module 614 for selecting a code table from a set of preconfigured code tables. Each preconfigured code table of the set of preconfigured code tables may be associated with a performance metric to facilitate the selection process. Once a selection is made, a coordinating module 616 may be utilized for coordinating the code table selected to at least one receiver.

The data communication system 600 may further comprise an evaluating module 618 for evaluating a performance metric of the code table. A determining module 620 may be utilized for determining whether the performance can be improved if the current code table is replaced with a new code table. If the performance may be improved, a replacing module 622 may be utilized to replace the current code table with the new code table, and the new code table will be utilized to facilitate subsequent data communications.

As aforementioned, the receiver is configured for transforming the vector of real numbers received into a best corresponding vector by utilizing the code table. In one embodiment, the receiver may comprise a vector generating module 624 for creating a set of candidates for said best corresponding vector; an associating module 626 for associating each candidate of the set of candidates with a confidence value, the confidence value for each candidate is determined based on a separation distance between the candidate and said vector of real numbers calculated utilizing said code table; and a transforming module 628 for transforming said vector of real numbers into the candidate with the best confidence value. In addition, the receiver may comprise a storage device configured for storing said best corresponding vector.

It is to be understood that the present disclosure may be conveniently implemented in forms of a software package. Such a software package may be a computer program product which employs a computer-readable storage medium including stored computer code which is used to program a computer to perform the disclosed function and process of the present invention. The computer-readable medium may include, but is not limited to, any type of conventional floppy disk, optical disk, CD-ROM, magnetic disk, hard disk drive, magneto-optical disk, ROM, RAM, EPROM, EEPROM, magnetic or optical card, or any other suitable media for storing electronic instructions.

It is understood that the specific order or hierarchy of steps in the foregoing disclosed methods are examples of exemplary approaches. Based upon design preferences, it is understood that the specific order or hierarchy of steps in the method can be rearranged while remaining within the scope of the present invention. The accompanying method claims present elements of the various steps in a sample order, and are not meant to be limited to the specific order or hierarchy presented.

It is believed that the present disclosure and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A data communication method, comprising:
  selecting a code table configured for facilitating said data communication, the code table containing a mapping from each possible n-bit data word to a corresponding m-element set of real numbers, wherein the mapping is generated by a matrix multiplication of an m×n matrix and each possible n-bit data word;
  obtaining a particular n-bit data word to be communicated;
  selecting a particular m-element set of real numbers from the code table, wherein the particular n-bit data word is mapped to the particular m-element set of real numbers in the code table; and
  transmitting via a transmitter said particular m-element set of real numbers to at least one receiver.

2. The method of claim 1, wherein said m×n matrix is generated as a function of at least one of: a time, a frequency and a phase offset.

3. The method of claim 1, wherein said selecting a code table configured for facilitating said data communication comprises:
determining a signal-to-noise ratio of a communication environment; and
selecting a code table where the mapping is generated by a matrix multiplication of an m×n matrix and each possible n-bit data word, wherein m is greater than or equal to n when the signal-to-noise ratio of the communication environment is low.

4. The method of claim 3, wherein said selecting a code table configured for facilitating said data communication further comprises:
verifying whether a minimum separation distance of the code table is above a required separation distance threshold.

5. The method of claim 1, further comprising:
coordinating the code table selected to said at least one receiver, wherein said at least one receiver is configured to transform the particular m-element set of real numbers to the particular n-bit data word based on the code table selected.

6. The method of claim 1, wherein a plurality of code tables is available for selection, and each of the plurality of code tables is associated with a performance metric.

7. The method of claim 6, further comprising:
evaluating a performance metric of said code table;
determining whether the performance can be improved when said code table is replaced with a second code table; and
replacing said code table with the second code table, wherein the second code table is utilized for facilitating subsequent data communication.

8. A data communication method, comprising:
obtaining a code table configured for facilitating data communication the code table containing a mapping from each possible n-bit data word to a corresponding m-element set of real numbers, wherein the mapping is generated by a matrix multiplication of an m×n matrix and each possible n-bit data word;
receiving a particular m-element set of real numbers; and
transforming the particular m-element set of real numbers to a particular n-bit data word based on the mapping contained in the code table.

9. The method of claim 8, wherein transforming the particular m-element set of real numbers to a particular n-bit data word further comprises:
creating a set of candidate n-bit data words;
determining a confidence value for each candidate of the set of candidate n-bit data words, where the confidence value for each candidate is determined based on a separation distance between the candidate and said particular m-element set of real numbers calculated based on said code table; and
transforming the particular m-element set of real numbers to a particular n-bit data word having a best confidence value.

10. A data communication system, comprising:
an input module for obtaining a particular n-bit data word to be communicated;
a code table selecting module for selecting a code table configured for facilitating said data communication, the code table containing a mapping from each possible n-bit data word to a corresponding m-element set of real numbers, wherein the mapping is generated by a matrix multiplication of an m×n matrix and each possible n-bit data word;
a vector selecting module for selecting particular m-element set of real numbers from the code table, wherein the particular n-bit data word is mapped to the particular m-element set of real numbers in the code table; and
a transmitter for transmitting said particular m-element set of real numbers to a receiver.

11. The system of claim 10, wherein said m×n matrix is generated as a function of at least one of: a time, a frequency and a phase offset.

12. The system of claim 10, wherein said code table selecting module comprises:
a determining module for determining a signal-to-noise ratio of a communication environment;
wherein the mapping of said code table is generated by a matrix multiplication of an m×n matrix and each possible n-bit data word, wherein m is greater than or equal to n when the signal-to-noise ratio of the communication environment is low.

13. The system of claim 12, wherein said determining module is further configured for verifying whether a minimum separation distance of the code table is above a required separation distance threshold.

14. The system of claim 10, further comprising:
a coordinating module for coordinating the code table selected to said receiver, wherein said receiver is configured to transform the particular m-element set of real numbers to the particular n-bit data word based on the code table selected.

15. The system of claim 10, wherein a plurality of code tables is available for selection, and each of the plurality of code tables is associated with a performance metric.

16. The system of claim 15, further comprising:
an evaluating module for evaluating a performance metric of said code table;
a determining module for determining whether the performance can be improved when said code table is replaced with a second code table; and
a replacing module for replacing said code table with the second code table, wherein the second code table is utilized for facilitating subsequent data communication.

17. The system of claim 10, wherein the receiver is configured for transforming the particular m-element set of real numbers to the particular n-bit data word, the receiver comprises:
a vector generating module for creating a set of candidate n-bit data words;
an associating module for associating each candidate of the set of candidate n-bit data words with a confidence value, the confidence value for each candidate is determined based on a separation distance between the candidate and said particular m-element set of real numbers calculated based on said code table; and
a transforming module for transforming the particular m-element set of real numbers to the particular n-bit data word having a best confidence value.

18. The system of claim 10, wherein the receiver comprises a storage device configured for storing said particular m-element set of real numbers.

* * * * *